US012813271B2

(12) United States Patent
Cui et al.

(10) Patent No.: US 12,813,271 B2
(45) Date of Patent: Nov. 24, 2026

(54) ELECTRONIC APPARATUS

(71) Applicant: HUAWEI TECHNOLOGIES CO., LTD., Shenzhen (CN)

(72) Inventors: Changzhi Cui, Beijing (CN); Junqing Xie, Dongguan (CN); Xuecheng Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 356 days.

(21) Appl. No.: 18/429,720

(22) Filed: Feb. 1, 2024

(65) Prior Publication Data

US 2024/0170363 A1 May 23, 2024

Related U.S. Application Data

(63) Continuation of application No. PCT/CN2022/090956, filed on May 5, 2022.

(30) Foreign Application Priority Data

Aug. 2, 2021 (CN) ......................... 202110881508.7

(51) Int. Cl.
*H10W 40/60* (2026.01)
*H10W 42/00* (2026.01)
*H10W 90/00* (2026.01)

(52) U.S. Cl.
CPC .......... *H10W 40/60* (2026.01); *H10W 40/611* (2026.01); *H10W 40/625* (2026.01); *H10W 42/121* (2026.01); *H10W 90/736* (2026.01)

(58) Field of Classification Search
CPC . H10W 40/60; H10W 40/611; H10W 40/625; H10W 42/121; H10W 90/736
See application file for complete search history.

(56) References Cited

U.S. PATENT DOCUMENTS

| | | | | |
|---|---|---|---|---|
| 5,944,093 | A * | 8/1999 | Viswanath | F28D 15/0241 174/15.2 |
| 7,518,235 | B2 * | 4/2009 | Coico | H10W 40/611 257/E23.084 |

(Continued)

FOREIGN PATENT DOCUMENTS

| | | | | |
|---|---|---|---|---|
| CN | 108598048 A * | 9/2018 | | H10W 40/60 |
| WO | WO-2012166122 A1 * | 12/2012 | | H10W 40/73 |
| WO | WO-2022100128 A1 * | 5/2022 | | H10W 76/12 |

OTHER PUBLICATIONS

PCT International Search Report for Application No. PCT/CN2022/090956 dated May 5, 2022, 9 pages.

(Continued)

*Primary Examiner* — Matthew E Warren

(57) ABSTRACT

An electronic apparatus, including a circuit board, a chip, a heat sink, and a limiting member. The chip is fastened to the circuit board. A surface that is of the chip and that is away from the circuit board forms a first heat dissipation surface. A surface that is of the heat sink and that faces the circuit board forms a second heat dissipation surface. A heat dissipation medium is provided between the second heat dissipation surface and the first heat dissipation surface of the chip. The limiting member is disposed on one of the heat sink and the circuit board, and forms a gap with the other. The heat sink is not carried on the limiting member and has a specific gap with the limiting member, and the second heat dissipation surface presses against the first heat dissipation surface when acting on the first heat dissipation surface.

10 Claims, 8 Drawing Sheets

(56) References Cited

U.S. PATENT DOCUMENTS

| | | | | |
|---|---|---|---|---|
| 7,800,218 | B2 * | 9/2010 | Iwakiri | H10W 40/10 257/713 |
| 2004/0084764 | A1 * | 5/2004 | Ishimine | H10W 40/611 257/E23.084 |
| 2008/0266808 | A1 | 10/2008 | Aberg et al. | |
| 2011/0134606 | A1 * | 6/2011 | Gallarelli | H05K 7/1007 361/679.54 |
| 2014/0161558 | A1 | 6/2014 | Hayashi et al. | |

OTHER PUBLICATIONS

Extended European Search Report for Application No. 22851635.7 dated Nov. 29, 2024, 9 pages.

* cited by examiner

ELECTRONIC APPARATUS

CROSS-REFERENCE TO RELATED APPLICATIONS

This application is a continuation of International Application No. PCT/CN2022/090956, filed on May 5, 2022, which claims priority to Chinese Patent Application No. 202110881508.7, filed on Aug. 2, 2021. The disclosures of the aforementioned applications are hereby incorporated by reference in their entireties.

TECHNICAL FIELD

This disclosure relates to the field of chip assembly, and in particular, to an electronic apparatus.

BACKGROUND

With development of communication technologies, chips with a large capacity, a high bandwidth, and high power consumption, such as graphics processing units (GPU), a central processing units (CPU), and a network processors, are more and more widely used. Power consumption of a single chip of these types reaches at least 300 W, and a subsequent power consumption roadmap of a communication chip will reach 500 W or even 1000 W. This poses a great challenge to heat dissipation of chips and systems. Many manufacturers reduce a heat dissipation path of a chip by removing a cover of the chip to expose the chip. However, this may cause inadequate protection of the chip, increasing a probability of chip damage.

During chip assembly, heat dissipation and protection of the chip need to be balanced. A heat dissipation problem of the chip with high power consumption needs to be addressed, and the chip needs to be effectively protected, to reduce the probability of the chip damage.

SUMMARY

This disclosure provides an electronic apparatus, which helps facilitate heat dissipation of a chip and effectively protects the chip.

A first aspect of embodiments of this disclosure provides an electronic apparatus, including a circuit board, a chip, a heat sink, and a limiting member. The chip is fastened to the circuit board. A surface that is of the chip and that is away from the circuit board forms a first heat dissipation surface. The heat sink is disposed on the circuit board. A surface that is of the heat sink and that faces the circuit board forms a second heat dissipation surface. A heat dissipation medium is provided between the second heat dissipation surface and the first heat dissipation surface of the chip. The limiting member is disposed on one of the heat sink and the circuit board, and forms a gap with the other.

In the electronic apparatus, there is a gap between the heat sink and the limiting member, and the heat dissipation medium is provided between the second heat dissipation surface and the first heat dissipation surface. In this way, the second heat dissipation surface directly acts on the first heat dissipation surface of the chip through the heat dissipation medium. This may reduce a spacing between the first heat dissipation surface and the second heat dissipation surface, and reduce an amount of the heat dissipation medium used between the first heat dissipation surface and the second heat dissipation surface, that is, reduces a thickness of the heat dissipation medium. The thickness of the heat dissipation medium is reduced, so that heat transfer efficiency between the first heat dissipation surface and the second heat dissipation surface may be improved, and heat dissipation efficiency of the chip is improved. In addition, when the heat sink is close to the chip, the limiting member may be in contact with the heat sink to prevent the heat sink from further moving. This reduces pressure of the heat sink on the chip, and reduces a probability that the chip is crushed. Different sizes of the limiting member may be used based on different chips or heat sinks. The size of the limiting member is controlled. This may adjust a size of the gap, and adjust maximum acting force applied when the heat sink presses against the chip. Correspondingly, if the limiting member is disposed on the heat sink, a gap is formed between the limiting member and the circuit board. When the heat sink is close to the chip, the limiting member may be in contact with the circuit board to prevent the heat sink from further moving. This reduces pressure of the heat sink on the chip, and reduces the probability that the chip is crushed.

Based on the first aspect, in a possible implementation, the electronic apparatus further includes a pressing part. The pressing part includes a first elastic member. One end of the first elastic member acts on the heat sink, and the other end acts on the circuit board, to provide elastic force to press the heat sink against the chip.

In the electronic apparatus, the pressing part provides elastic pressure to press the heat sink against the chip. In this way, the first heat dissipation surface and the second heat dissipation surface are as close as possible, and there is no gap in the heat dissipation medium between the first heat dissipation surface and the second heat dissipation surface as much as possible. This improves heat transfer efficiency of the heat dissipation medium.

Based on the first aspect, in a possible implementation, the pressing part further includes a first guide post. The first guide post is fastened to the circuit board. The heat sink is provided with a first guide hole. The first guide post passes through the first guide hole.

In the electronic apparatus, the first guide post guides relative movement of the heat sink and the chip. In this case, when the heat sink approaches or moves away from the chip, the second heat dissipation surface is always aligned with the first heat dissipation surface.

Based on the first aspect, in a possible implementation, the first elastic member includes a first compression spring. A first mounting head is disposed at one end that is of the first guide post and that is away from the circuit board. The first compression spring is sleeved outside the first guide post. One end of the first compression spring acts on the first mounting head, and the other end acts on the heat sink.

In the electronic apparatus, the first compression spring can provide stable elastic force. This may reduce a probability that the heat sink crushes the chip due to excessively large elastic force.

Based on the first aspect, in a possible implementation, the electronic apparatus further includes a floating part. The floating part includes a second elastic member. One end of the second elastic member acts on the heat sink, and the other end acts on the circuit board, to provide elastic force to move the heat sink away from the chip.

In the electronic apparatus, the floating part provides the elastic force to move the heat sink away from the chip, and the floating part may counteract a part of the elastic force of the pressing part. This reduces pressure of the heat sink on the chip. In addition, the floating part cooperates with the pressing part, so that the heat sink can be in a stable position relative to the chip. After the heat sink moves relative to the chip due to external force, under joint action of the floating part and the pressing part, the heat sink can return to a position before relative movement.

Based on the first aspect, in a possible implementation, the floating part further includes a second guide post. The second guide post is fastened to the circuit board. The heat sink is provided with a second guide hole. The second guide post passes through the second guide hole.

In the electronic apparatus, the second guide post guides relative movement of the heat sink and the chip. In this case, when the heat sink approaches or moves away from the chip, the second heat dissipation surface is always aligned with the first heat dissipation surface.

Based on the first aspect, in a possible implementation, the second elastic member includes a second compression spring. The second compression spring is sleeved outside the second guide post. One end of the second compression spring acts on the circuit board, and the other end acts on the heat sink.

In the electronic apparatus, the second compression spring can provide stable elastic force. The second compression spring jointly acts with the first compression spring, to reduce the probability that the heat sink crushes the chip due to excessively large elastic force.

Based on the first aspect, in a possible implementation, the heat sink includes a mounting part and a boss. The boss is disposed on a surface that is of the mounting part and that faces the chip. An end face of the boss forms the second heat dissipation surface. The mounting part has a limiting surface. The gap is formed between the limiting surface and the limiting member, or the limiting member is fixedly disposed on the limiting surface.

In the electronic apparatus, the boss of the heat sink may reduce the spacing between the first heat dissipation surface and the second heat dissipation surface.

Based on the first aspect, in a possible implementation, a size of the limiting member in a first direction perpendicular to the first heat dissipation surface is H. The size H of the limiting member meets a relational expression:

$$H=H_1+(H_2\times\cos\theta)-(L-H_2\times\sin\theta)\times\tan\theta.$$

In this formula, a value of θ is less than 5°. $H_1$ is a size of the chip in the first direction. $H_2$ is a distance between the second heat dissipation surface and the limiting surface in the first direction. L is a distance, in a second direction perpendicular to the first direction, from a side that is of the limiting member and that is away from the chip to a side that is of the chip and that is close to the limiting member.

In the electronic apparatus, a relationship between H and L is limited. In this way, the heat sink tilts relative to the chip, and when the heat sink acts on the limiting member, a tilt angle θ is not greater than 5°. This effectively reduces force on the chip. Therefore, even if the heat sink tilts relative to the chip, the chip is not likely to be crushed.

Based on the first aspect, in a possible implementation, the limiting member is a support frame. The support frame has a window. The chip is located in the window.

In the electronic apparatus, the limiting member is disposed as a support frame. The support frame reinforces the circuit board. The chip is disposed in the window of the support frame, that is, the support frame is disposed around the chip. A part of the support frame may limit relative movement of the heat sink and the chip. The support frame has higher strength of connection with the circuit board, and the support frame has higher strength to maintain a shape. Therefore, the support frame is used as the limiting member. This can improve stability of the limiting member, and improve limiting accuracy of the limiting member, to avoid a position change of the limiting member caused by deformation of the circuit board as much as possible.

Based on the first aspect, in a possible implementation, a fastening through hole that is used to mount a bolt is provided in the limiting member. The bolt is configured to fasten the support frame and the circuit board.

In the electronic apparatus, the support frame is fastened to the circuit board through the bolt. The bolt protrudes a specific distance out of the support frame. A part protruding out of the support frame is used to limit relative movement of the heat sink and the chip. This may prevent the heat sink from excessively tilting relative to the chip.

Based on the first aspect, in a possible implementation, the support frame includes at least two windows. One chip is disposed at a position corresponding to each window on the circuit board.

In the electronic apparatus, each window of the support frame may correspond to one chip, and each chip may separately correspond to one heat sink. Each heat sink may use a mounting structure corresponding to the chip, to ensure an appropriate distance between the heat sink and the chip, and an appropriate distance between the heat sink and the support frame. This may prevent the heat sink from excessively tilting relative to the chip.

Based on the first aspect, in a possible implementation, the circuit board includes a first board and a second board. The chip is disposed on the second board. A plurality of mounting through holes are provided in the second board. The limiting member is disposed on the first board. The limiting member passes through the second board from the mounting through hole.

In the electronic apparatus, when the second board is extremely soft or extremely compact, the second board is not suitable for mounting the limiting member. In this case, the limiting member may be disposed on the first board outside the second board, and the limiting member extends out from the mounting through hole.

DESCRIPTION OF REFERENCE SIGNS OF MAIN COMPONENTS

Figure 1:
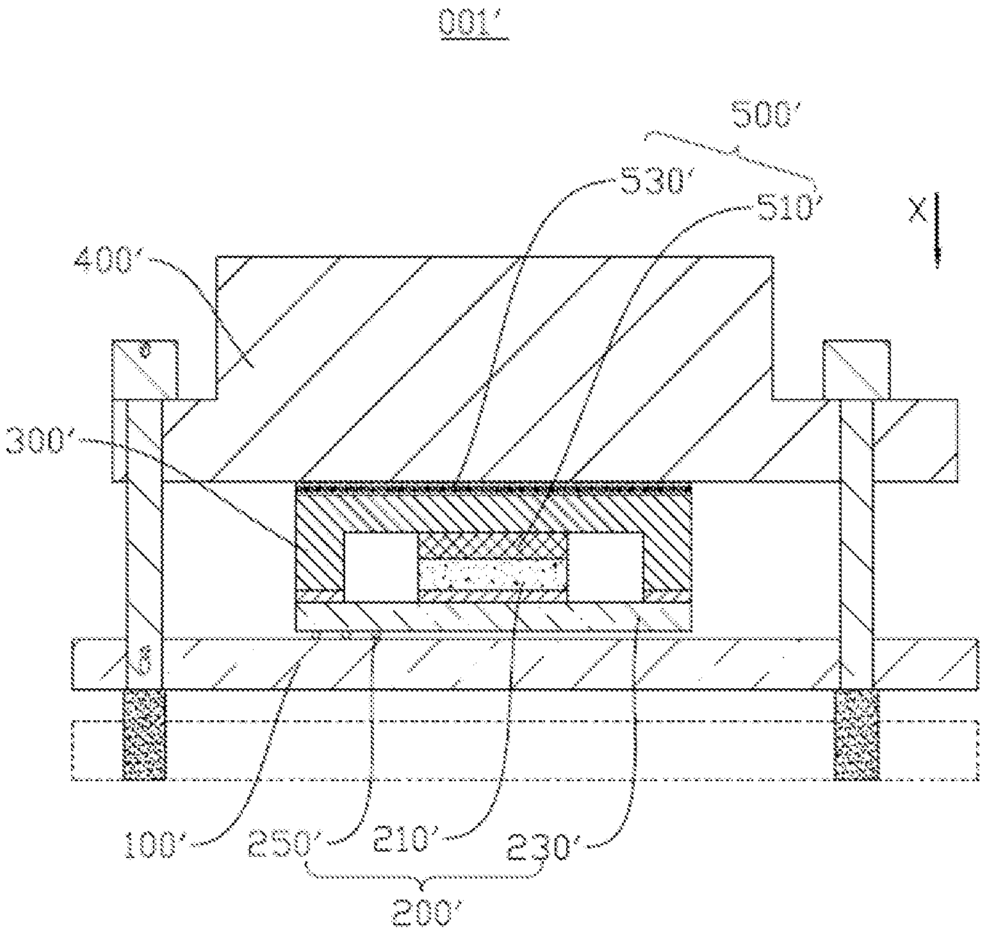
FIG. 1 is a sectional view of an existing electronic apparatus.

Electronic apparatus 001, 001'
Window 011
Through hole part 013
Fastening through hole 0131
Counterbore 0133
Circuit board 100, 100'
First board 110
Second board 130
Mounting through hole 131
Chip 200, 200'
First heat dissipation surface 201, 201'
Chip body 210, 210'
Substrate 230, 230'
Solder ball 250, 250'
Cover body 300'
Heat sink 400, 400'
Second heat dissipation surface 401
Boss 410, 410'
Mounting part 430
Baseplate 431
Reinforcing plate 433
Limiting surface 4331
Fin 450
Heat dissipation medium 500, 500'
Internal heat dissipation medium 510'
External heat dissipation medium 530'
Mounting ring 600'
Limiting member 700
Support frame 710
Limiting area 711
Gap 701
Pressing part 810
First guide post 811
First elastic member 813
First mounting head 815
Floating part 830
Second guide post 831
Second elastic member 833
Second mounting head 835
First direction X
Second direction Y Embodiments of the present invention are further described with reference to the accompanying drawings in the following specific implementations.

DESCRIPTION OF EMBODIMENTS

The following describes implementations of this disclosure by using specific embodiments. A person skilled in the art may easily learn of other advantages and effect of this disclosure based on content disclosed in this specification. Although this disclosure is described with reference to an example embodiment, it does not mean that a feature of this disclosure is limited only to this embodiment. On the contrary, a purpose of describing this disclosure with reference to an implementation is to cover other options or modifications that may be derived based on claims of this disclosure. To provide an in-depth understanding of this disclosure, the following descriptions include a plurality of specific details. This disclosure may be alternatively implemented without using these details. In addition, to avoid confusion or blurring a focus of this disclosure, some specific details are omitted from the description. It should be noted that embodiments in this disclosure and the features in embodiments may be mutually combined in the case of no conflict.

The following terms “first”, “second”, and the like are only used for description, and shall not be understood as an indication or implication of relative importance or implicit indication of a quantity of indicated technical features. Therefore, a feature limited by “first”, “second”, or the like may explicitly or implicitly include one or more features. In description of this disclosure, unless otherwise stated, “a plurality of” means two or more than two. Orientation terms such as “up”, “down”, “left”, and “right” are defined relative to an orientation of schematic placement of components in the accompanying drawings. It should be understood that these directional terms are relative concepts and are used for relative description and clarification. These directional terms may vary accordingly depending on an orientation in which the components are placed in the accompanying drawings.

In this disclosure, unless otherwise explicitly specified and limited, a term “connection” should be understood in a broad sense. For example, the “connection” may be a fastened connection, a detachable connection, or an integrated connection; and may be a direct connection or an indirect connection by using an intermediate medium. The term “and/or” used in this specification includes any and all combinations of one or more related listed items.

When the following embodiments are described with reference to schematic diagrams, for ease of description, a diagram indicating a partial structure of a component is partially enlarged not based on a general scale. In addition, the schematic diagrams are only examples, and should not limit the protection scope of this disclosure herein.

To make the objectives, technical solutions, and advantages of this disclosure clearer, the following further describes the implementations of this disclosure with reference to the accompanying drawings.

FIG. 1 is a sectional view of an existing electronic apparatus 001'.

As shown in FIG. 1, the electronic apparatus 001' includes a circuit board 100', a chip 200', a cover body 300', and a heat sink 400'. The circuit board 100' uses a printed circuit board (PCB). The chip 200' includes a chip body 210' and a substrate 230'. The chip body 210' is fastened to the substrate 230'. The substrate 230' is fastened to the circuit board 100' by using a solder ball 250'. In some implementations, the substrate 230' may alternatively be disposed on the circuit board 100' by using another fastening structure such as a contact.

The cover body 300' is fixedly disposed on the substrate 230'. The cover body 300' covers a surface that is of the chip 200' and that is away from the substrate 230'. An internal heat dissipation medium 510' is filled between the cover body 300' and the chip 200'. This may enhance heat transfer efficiency between the cover body 300' and the chip 200'. The cover body 300' is made of hard metal, and may effectively protect the chip 200'. The heat sink 400' is disposed on the circuit board 100'. An external heat dissipation medium 530' is filled between the heat sink 400' and the cover body 300'. The external heat dissipation medium 530' and the internal heat dissipation medium 500' may enhance heat transfer efficiency between the heat sink 400' and the cover body 300'. In the electronic apparatus 001', heat emitted by the chip 200' needs to be transferred to the cover body 300' through the internal heat dissipation medium 510', and then transferred to the heat sink 400' through the cover body 300', the external heat dissipation medium 530', and the internal heat dissipation medium 500'. A heat transfer path is long. As a result, heat dissipation efficiency of the chip 200' is low. When power of the chip 200' is large, accumulated heat is likely to generate and affects operation of the chip 200'.

Figure 2:
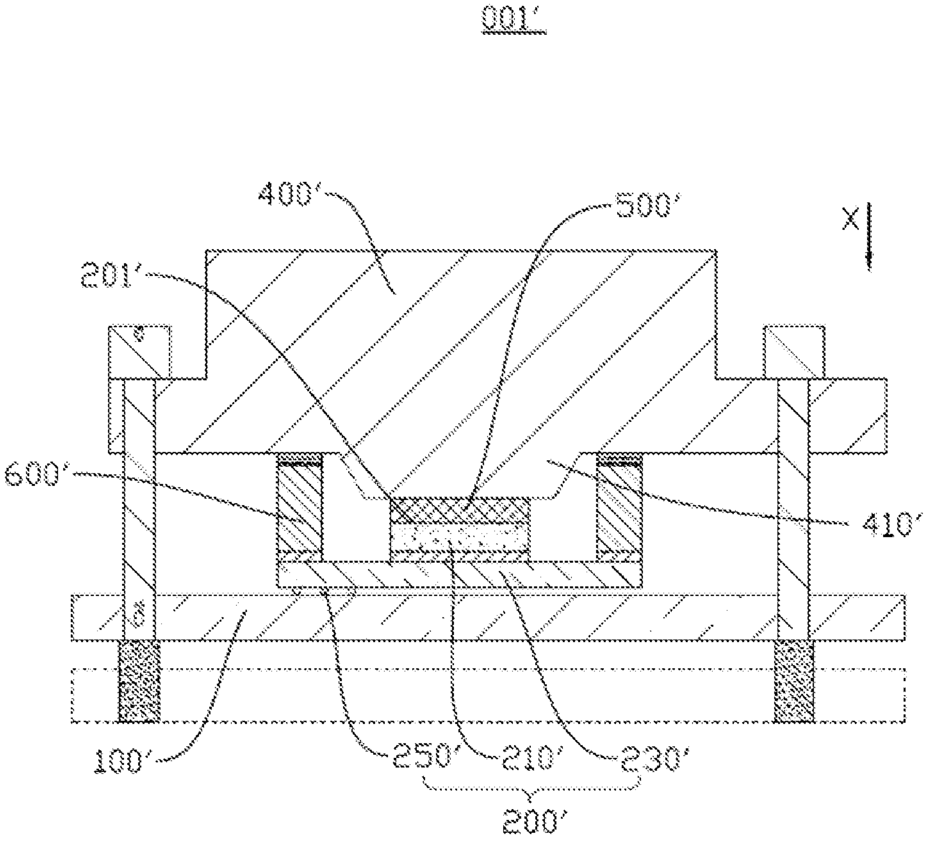
FIG. 2 is a sectional view of another existing electronic apparatus.

FIG. 2 is a sectional view of an existing electronic apparatus 001'.

As shown in FIG. 2, the electronic apparatus 001' includes a circuit board 100', a chip 200', a mounting ring 600', and a heat sink 400'. The chip 200' includes a chip body 210' and a substrate 230'. The chip body 210' is fastened to the substrate 230'. A surface that is of the substrate 230' and that is away from the chip body 210' is fastened to the circuit board 100' by using a solder ball 250'. The mounting ring 600' is disposed on the substrate 230'. The mounting ring 600' is disposed around a periphery of the chip 200'. A surface that is of the chip 200' and that is away from the substrate 230' forms a first heat dissipation surface 201'. In a first direction X perpendicular to the first heat dissipation surface 201', a size of the mounting ring 600' is greater than a size of the chip 200'. The heat sink 400' is disposed on the circuit board 100'. The heat sink 400' includes a boss 410' that is disposed facing the chip 200'. The heat sink 400' is supported by using the mounting ring 600' on the circuit board 100, so that the boss 410' is close to the first heat dissipation surface 201' of the chip 200'. The first heat dissipation surface 201' is a surface that is of the chip 200' and that is away from the substrate 230'. A heat dissipation medium 500' is disposed between the chip 200' and the heat sink 400'. Heat generated by the chip 200' is transferred to the heat sink 400' through the heat dissipation medium 500', and then dissipated through the heat sink 400'. In the first direction X perpendicular to the first heat dissipation surface 201', a size of the heat dissipation medium 500' is determined based on a plurality of tolerances. In the first direction X, the tolerances for determining the size of the heat dissipation medium 500' include: coplanarity of the boss 410', a dimensional tolerance of the boss 410' in the first direction X, flatness of a position at which the boss 410' is disposed on the heat sink 400', flatness of the first heat dissipation surface 201', a dimensional tolerance of the chip 200' in the first direction X, a dimensional tolerance of solder of the chip 200' in the first direction X, a tolerance formed by reflow soldering deformation of the substrate 230', flatness of the mounting ring 600', a dimensional tolerance of the mounting ring 600' in the first direction X, a tolerance formed by reflow soldering deformation of the mounting ring 600', and a tolerance of a fastening material between the mounting ring 600' and the substrate 230'. In other words, there are at least 11 tolerances for determining the size of the heat dissipation medium 500'. As a result, the size of the heat dissipation medium 500' in the first direction X is large. An increase in the size of the heat dissipation medium 500' in the first direction X causes a decrease in heat transfer efficiency of the heat dissipation medium 500'. Therefore, although supporting the heat sink 400' through the mounting ring 600' saves a heat dissipation step of the cover body 300', it is still difficult to achieve better heat dissipation effect.

Figure 3:
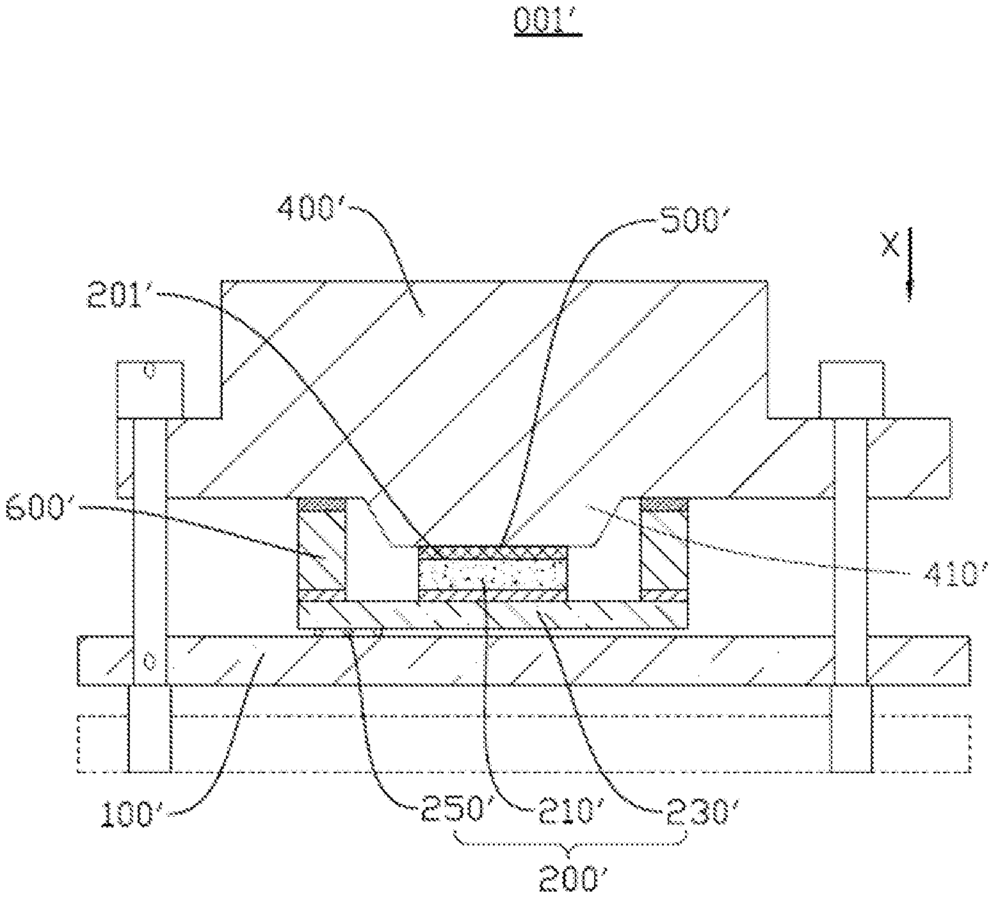
FIG. 3 is a sectional view of another existing electronic apparatus.

FIG. 3 is a sectional view of an existing electronic apparatus 001'.

As shown in FIG. 3, the electronic apparatus 001' includes a circuit board 100', a chip 200', a mounting ring 600', and a heat sink 400'. The chip 200' includes a chip body 210' and a substrate 230'. The chip body 210' is fastened to the substrate 230'. A surface that is of the substrate 230' and that is away from the chip body 210' is fastened to the circuit board 100' by using a solder ball 250'. The mounting ring 600' is disposed on the substrate 230'. The mounting ring 600' is disposed around a periphery of the chip 200'. A surface that is of the chip 200' and that is away from the substrate 230' forms a first heat dissipation surface 201'. In a first direction X perpendicular to the first heat dissipation surface 201', a size of the mounting ring 600' is slightly greater than a size of the chip 200'. The heat sink 400' is disposed on the circuit board 100' by using a mounting member. The heat sink 400' includes a boss 410' that is disposed facing the chip 200'. The heat sink 400' presses against the first heat dissipation surface 201' of the chip 200' on the circuit board 100'. The first heat dissipation surface 201' is a surface that is of the chip 200' and that is away from the substrate 230'. The heat sink 400' provides pressure for pressing against the chip 200' and support force of the chip 200' by using the mounting member, to maintain balance. A buffer material is disposed between the mounting ring 600' and the heat sink 400'. The buffer material provides only small support force. In this way, the heat sink 400' presses against the chip 200' as much as possible to reduce a distance between the boss 410' and the first heat dissipation surface 201'.

For the electronic apparatus 001' shown in FIG. 3, only a small quantity of the heat dissipation media 500' need to be filled between the boss 410' and the chip 200'. However, the pressure of the heat sink 400' on the chip 200' is large. In a process of transporting or using the electronic apparatus 001', when the heat sink 400' impacts the chip 200' due to external force, the chip 200' is likely to be crushed due to pressure. Especially, when the heat sink 400' tilts relative to the chip 200' due to external force, a force-bearing surface of the chip 200' is reduced, and the chip 200' may be crushed due to increased local pressure.

Figure 4:
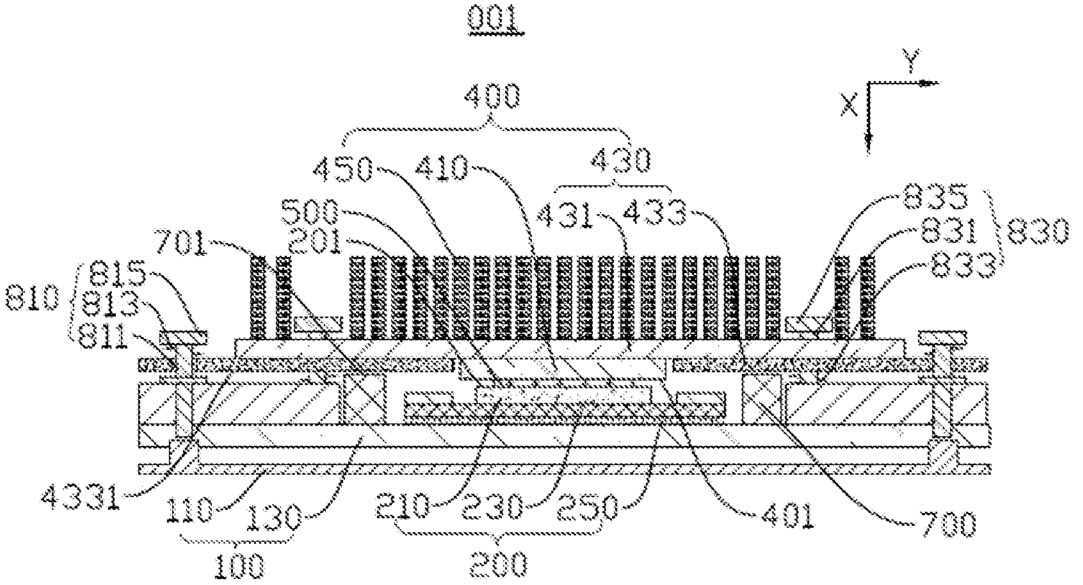
FIG. 4 is a sectional view of an electronic apparatus according to an embodiment of this disclosure.

FIG. 4 is a sectional view of an electronic apparatus 001 according to an embodiment of this disclosure.

As shown in FIG. 4, the electronic apparatus 001 includes a circuit board 100, a chip 200, a heat sink 400, and a limiting member 700. The circuit board 100 includes a first board 110 and a second board 130. The second board 130 is a PCB. The first board 110 is a metal plate. The second board 130 is fastened to a surface of the first board 110. The chip 200 includes a chip body 210 and a substrate 230. A surface that is of the substrate 230 and that is away from the chip body 210 is disposed on a surface that is of the second board 130 and that is away from the first board 110. The chip 200 is electrically connected to the circuit board 100, so that a signal can be transmitted between the chip 200 and the circuit board 100. A surface that is of the chip 200 and that is away from the circuit board 100 forms a first heat dissipation surface 201. Heat generated by the chip 200 leaves the chip 200 through the first heat dissipation surface 201. The heat sink 400 is disposed on the circuit board 100. The heat sink 400 is located on the surface that is of the chip 200 and that is away from the circuit board 100. A surface that is of the heat sink 400 and that faces the chip 200 forms a second heat dissipation surface 401. Heat is transferred between the first heat dissipation surface 201 and the second heat dissipation surface 401. The heat sink 400 absorbs the heat emitted by the chip 200 and carries the heat away from the chip 200. A plurality of limiting members 700 are fastened to the circuit board 100. The limiting member 700 extends towards the heat sink 400. Optionally, the limiting member 700 is fastened to the circuit board 100 by using a thread. The limiting member 700 is alternatively surface-mounted on the circuit board 100. When the heat sink 400 is disposed on the circuit board 100 and does not bear another external force, the heat sink 400 and the chip 200 are at initial relative positions. At the initial relative positions, the first heat dissipation surface 201 and the second heat dissipation surface 401 are approximately in parallel. A heat dissipation medium 500 is filled between the first heat dissipation surface 201 and the second heat dissipation surface 401. Heat generated by the first heat dissipation surface 201 is transferred to the second heat dissipation surface 401 through the heat dissipation medium 500.

There is a gap 701 between the limiting member 700 and the heat sink 400. The limiting member 700 is not in direct contact with the heat sink 400, so that the heat sink 400 presses against the chip 200. This may reduce a spacing between the first heat dissipation surface 201 and the second heat dissipation surface 401, reduce a size of the heat dissipation medium 500 between the first heat dissipation surface 201 and the second heat dissipation surface 401, and improve heat transfer efficiency between the chip 200 and the heat sink 400. In addition, the gap 701 allows the heat sink 400 to be close to the chip 200, to reduce rigid force in the electronic apparatus 001. After the heat sink 400 moves to be in contact with the limiting member 700, the limiting member 700 may further prevent the heat sink 400 from applying more pressure to the chip 200. This protects the chip 200, and reduces a probability that the chip 200 is crushed by the heat sink 400. For example, in a transportation process, if a heat dissipation structure of the chip 200 suddenly falls in a direction perpendicular to the first heat dissipation surface 201, when the heat dissipation structure of the chip 200 falls to be in contact with the ground, the heat sink 400 approaches the chip 200 in the direction perpendicular to the first heat dissipation surface 201 due to inertia. The limiting member 700 may be in contact with the heat sink 400, to prevent the heat sink 400 from further approaching the chip 200. This protects the chip 200, and reduces a probability that the chip 200 is crushed.

The heat sink 400 includes a mounting part 430 and a boss 410. The boss 410 is disposed on a surface that is of the mounting part 430 and that faces the chip 200. The boss 410 protrudes towards the chip 200. A surface that is of the boss 410 and that is away from the mounting part 430 forms the second heat dissipation surface 401. The boss 410 may be disposed to reduce the spacing between the first heat dissipation surface 201 and the second heat dissipation surface 401.

The mounting part 430 includes a baseplate 431 and a reinforcing plate 433. The heat sink 400 is made of metal with high heat transfer efficiency. The reinforcing plate 433 is made of metal with high hardness. The reinforcing plate 433 is disposed, to further increase strength of the heat sink 400, and reduce a probability of deformation of the heat sink 400 in a use process. This stabilizes pressure of the heat sink 400 on the chip 200, and reduces a probability that the heat sink 400 crushes the chip 200 due to deformation.

The reinforcing plate 433 is a ring. The reinforcing plate 433 is fastened to a surface that is of the baseplate 431 and that faces the circuit board 100. The boss 410 is located in the middle of the reinforcing plate 433. A limiting surface 4331 is formed on a surface that is of the reinforcing plate 433 and that faces the limiting member 700. The foregoing gap 701 is formed between the limiting surface 4331 and the limiting member 700. In a first direction X, a distance from the second heat dissipation surface 401 of the boss 410 to the first heat dissipation surface 201 is less than a distance from an end face of the reinforcing plate 433 to the first heat dissipation surface 201. A plurality of fins 450 are disposed on a surface that is of the baseplate 431 and that is away from the reinforcing plate 433. The fins 450 may increase a specific surface area of the heat sink 400. Heat of the heat sink 400 is dissipated to an environment through the fins 450. This improves heat dissipation efficiency of the heat sink 400.

The heat sink 400 is disposed on the circuit board 100 through a pressing part 810 and a floating part 830. The pressing part 810 includes a first guide post 811 and a first elastic member 813. The reinforcing plate 433 of the heat sink 400 is provided with a first guide hole. The first guide post 811 passes through the first guide hole. An extension direction of the first guide post 811 is perpendicular to the first heat dissipation surface 201. Guided by the first guide post 811 and the first guide hole, the heat sink 400 approaches or moves away from the chip 200 as much as possible in the direction perpendicular to the first heat dissipation surface 201. However, to reduce friction between the first guide post 811 and an inner wall of the first guide hole, an outer diameter of the first guide post 811 is slightly less than an inner diameter of the first guide hole.

The first elastic member 813 includes a first compression spring. A first mounting head 815 is fixedly disposed on a part that is of the first guide post 811 and that extends out of the heat sink 400 from the first guide hole. The first mounting head 815 is located at one end that is of the first guide post 811 and that is away from the circuit board 100, and a surface that is of the first mounting head 815 and that faces the circuit board 100 forms a first stop surface. The first compression spring is sleeved outside the first guide post 811. One end of the first compression spring acts on the first stop surface, and the other end acts on the heat sink 400. Elastic extension of the first compression spring may provide elastic force to press the heat sink 400 against the chip 200.

A plurality of first guide posts 811 and a plurality of corresponding first elastic members 813 are arranged circumferentially around the chip 200. The plurality of first elastic members 813 provide elastic force for the heat sink 400. In this way, the heat sink 400 is approximately parallel to the first heat dissipation surface 201 under combined action of a plurality of elastic force, and the heat sink 400 keeps the second heat dissipation surface 401 approximately parallel to the first heat dissipation surface 201 under the action of the elastic force.

When the relative positions of the heat sink 400 and the chip 200 are maintained, the pressure of the heat sink 400 on the chip 200 needs to be reduced. Under joint action of the pressing part 810 and the floating part 830, the heat sink 400 is located at a floating relative position relative to the chip 200, that is, after moving away from or approaching the chip 200, the heat sink 400 can return to an initial position under acting force. At the initial position, the pressure of the heat sink 400 on the chip 200 is appropriate, and there is no gap in the heat dissipation medium 500 between the chip 200 and the heat sink 400 as much as possible. This ensures heat transfer efficiency of the heat dissipation medium 500.

The floating part 830 includes a second guide post 831 and a second elastic member 833. The mounting part 430 of the heat sink 400 is provided with a second guide hole. The second guide hole passes through an overlapping part between the reinforcing plate 433 and the baseplate 431. The second guide post 831 passes through the second guide hole. An extension direction of the second guide post 831 is perpendicular to the second heat dissipation surface 401. Guided by the second guide post 831 and the second guide hole, the heat sink 400 approaches or moves away from the chip 200 as much as possible in the direction perpendicular to the first heat dissipation surface 201. However, to reduce friction between the second guide post 831 and an inner wall of the second guide hole, an outer diameter of the second guide post 831 is slightly less than an inner diameter of the second guide hole.

The second elastic member 833 includes a second compression spring. A second mounting head 835 is fixedly disposed on a part that is of the second guide post 831 and that extends out of the heat sink 400 from the second guide hole. The second mounting head 835 is located at one end that is of the second guide post 831 and that is away from the circuit board 100, and forms a second stop surface on a surface that is of the second mounting head 835 and that faces the circuit board 100. The second stop surface may stop the heat sink 400 from moving excessively away from the circuit board 100. The second compression spring is sleeved outside the second guide post 831. One end of the second compression spring acts on the circuit board 100, and the other end acts on the heat sink 400. Elastic extension of the second compression spring may provide elastic force to move the heat sink 400 away from the chip 200.

A plurality of second guide posts 831 and a plurality of corresponding second elastic members 833 are arranged circumferentially around the chip 200. The plurality of second elastic members 833 provide elastic force for the heat sink 400. In this way, the heat sink 400 is approximately parallel to the first heat dissipation surface 201 under combined action of a plurality of elastic force, and the heat sink 400 keeps the first heat dissipation surface 201 approximately parallel to the second heat dissipation surface 401 under the action of the elastic force.

In an initial state, the limiting member 700 is not in contact with the heat sink 400, and the heat sink 400 presses against the chip 200. Therefore, in the first direction X, a size of the heat dissipation medium 500 between the heat sink 400 and the chip 200 is related to only two tolerances: flatness of the first heat dissipation surface 201 and flatness of the second heat dissipation surface 401. In this way, the heat dissipation medium 500 can have a small size in the first direction X. This improves the heat transfer efficiency between the chip 200 and the heat sink 400.

It may be understood that, the first elastic member 813 may further include a first elastic gasket. Two first elastic gaskets are respectively fastened to two ends of the first compression spring. The first compression spring acts on both the first guide post 811 and the heat sink 400 through the first elastic gaskets. The first elastic gasket may disperse elastic force of the first compression spring, so that local pressure applied by the first compression spring to both the first guide post 811 and the heat sink 400 is reduced. Force applied to the first guide post 811 and the heat sink 400 are even. In addition, a probability that the first compression spring damages the first guide post 811 and the heat sink 400 may be reduced.

It may be understood that the first elastic member 813 may further include a second elastic gasket. Two second elastic gaskets are respectively fastened to two ends of the second compression spring. The second compression spring acts on both the circuit board 100 and the heat sink 400 through the second elastic gaskets. The second elastic gasket may disperse elastic force of the second compression spring, so that local pressure applied by the second compression spring to both the circuit board 100 and the heat sink 400 is reduced. Force applied to the circuit board 100 and the heat sink 400 are even. In addition, a probability that the second compression spring damages the circuit board 100 and the heat sink 400 may be reduced.

It may be understood that the limiting member 700 limits movement of the heat sink 400 relative to the chip 200, to protect the chip 200. The limiting member 700 may not be fastened to the circuit board 100. The limiting member 700 may be fastened to a surface that is of the heat sink 400 and that faces the circuit board 100. When the electronic apparatus 001 is in an initial state, the gap 701 is formed between the limiting member 700 and the circuit board 100. When the heat sink 400 moves relative to the chip 200, the heat sink 400 drives the limiting member 700 to approach the circuit board 100 until the limiting member 700 is in contact with the circuit board 100, to prevent further displacement of the heat sink 400.

Figure 5:
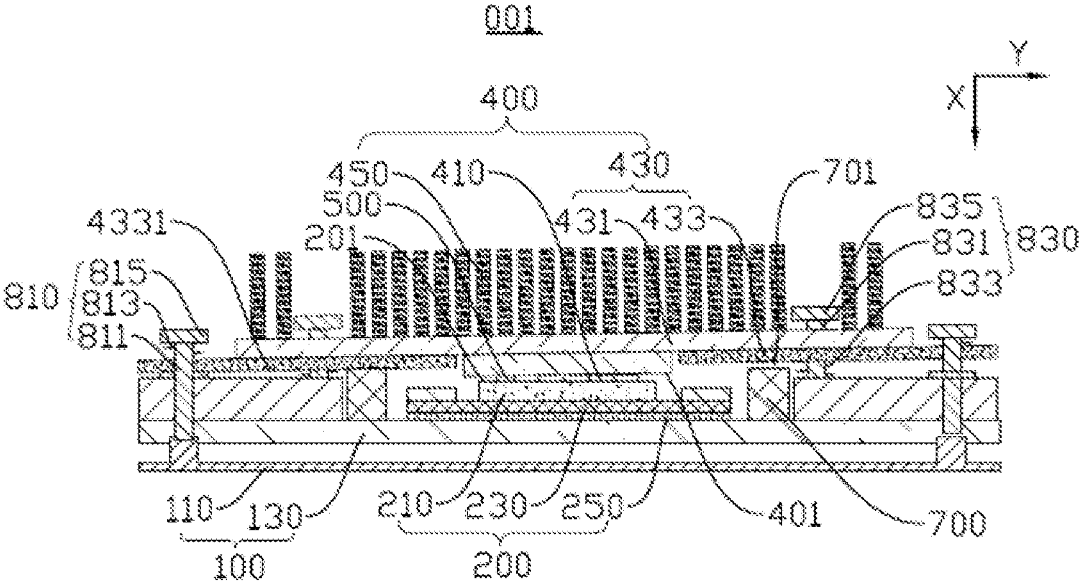
FIG. 5 is a sectional view of an electronic apparatus in which a heat sink tilts relative to a chip according to an embodiment of this disclosure.
Figure 6:
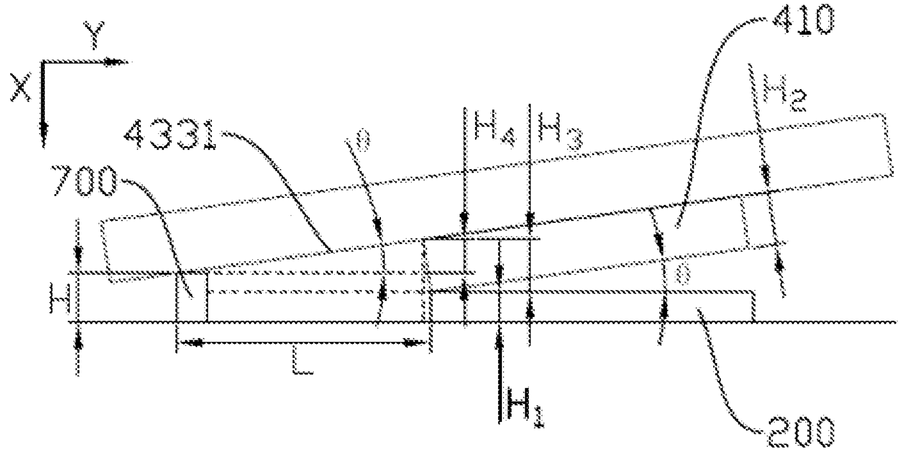
FIG. 6 is a simple schematic diagram of a structure of FIG. 5.

FIG. 5 is a sectional view of an electronic apparatus 001 according to an embodiment of this disclosure. A heat sink 400 tilts relative to a chip 200. FIG. 6 is a simplified schematic diagram of a structure in FIG. 5. Related sizes are marked in the figure.

As shown in FIG. 5, the heat sink 400 in the electronic apparatus 001 tilts relative to the chip 200, so that an included angle θ is formed between a first heat dissipation surface 201 and a second heat dissipation surface 401. In this case, the heat sink 400 is in contact with one limiting member 700. The limiting member 700 prevents the heat sink 400 from further tilting.

In a transportation process, if a heat dissipation structure of the chip 200 suddenly falls in a direction tilted to the first heat dissipation surface 201, when the heat dissipation structure of the chip 200 falls to be in contact with the ground, the heat sink 400 rotates by a specific angle relative to the chip 200 due to inertia. The limiting member 700 may be in contact with the heat sink 400, to prevent the heat sink 400 from further rotating relative to the chip 200. This protects the chip 200, and reduces a probability that the chip 200 is crushed.

When the heat sink 400 applies same pressure to the chip 200, a larger included angle θ indicates a smaller force-bearing surface of the chip 200. This causes increased pressure on the chip 200, and increases the probability that the chip 200 is crushed. Therefore, the included angle θ needs to be controlled. In this way, when the heat sink 400 is in contact with the limiting member 700, the included angle θ between the first heat dissipation surface 201 and the second heat dissipation surface 401 is less than 5°. In other words, a maximum value of the included angle θ that can be present between the first heat dissipation surface 201 and the second heat dissipation surface 401 is less than 5°. When the included angle θ present between the first heat dissipation surface 201 and the second heat dissipation surface 401 is greater than 5°, the probability that the chip 200 is crushed is greatly increased.

It may be understood that, when the chip 200 and the heat sink 400 are in another case, and the heat sink 400 tilts relative to the chip 200, a value of the included angle θ may be controlled, to effectively protect the chip 200, and reduce the probability that the chip 200 is crushed.

The included angle θ between the first heat dissipation surface 201 and the second heat dissipation surface 401 is related to a size of the limiting member 700 and a distance between the limiting member 700 and the chip 200.

When the heat sink 400 and the chip 200 are at initial positions, a direction perpendicular to the first heat dissipation surface 201 is a first direction X. In the first direction X, relative to a circuit board 100, the size of the limiting member 700 is H, and a size of the chip 200 is $H_1$. The chip 200 and the limiting member 700 are mounted on a same surface of the circuit board 100. The size of the limiting member 700 is greater than the size of the chip 200. A height difference ($H-H_1$) exists between a surface that is of the limiting member 700 and that is away from the circuit board 100 and the first heat dissipation surface 201. Specifically, a substrate 230 in the chip 200 is fastened to the circuit board 100 by using a solder ball 250. The size $H_1$ of the chip 200 further includes a size of the solder ball 250. A size from the second heat dissipation surface 401 of the boss 410 to a limiting surface 4331 is $H_2$. Optionally, the substrate 230 may alternatively be disposed on the circuit board 100 by using another fastening structure such as a contact. The size $H_1$ of the chip 200 further includes a size of the fastening structure.

As shown in FIG. 5 and FIG. 6, in a second direction Y perpendicular to the first direction X, a size of a distance from a side that is of the limiting member 700 and that is away from the chip 200 to a side that is of the chip 200 and that is close to the limiting member 700 is L. When the heat sink 400 tilts relative to the chip 200, a size of a distance from a position at which the heat sink 400 is in contact with the limiting member 700 to a position at which the boss 410 is in contact with the chip 200 is L. In the first direction X, a size from a side that is of a cross section of the boss 410 located at the limiting surface 4331 and that is close to the limiting member 700 to a first limiting surface 4331 is $H_3$, and a size from the side that is of the cross section of the boss 410 located at the limiting surface 4331 and that is close to the limiting member 700 to a limiting support post is $H_4$.

$H_3$ may be calculated according to the following formula:

$$H_3=H_2\times\cos\theta$$

$H_4$ may be calculated according to the following formula:

$$H_4=(L-H_2\times\sin\theta)\times\tan\theta$$

It can be seen from FIG. 6 that:

$$H=H_1+H_3-H_4=H_1+(H_2\times\cos\theta)-(L-H_2\times\sin\theta)\times\tan\theta$$

When the included angle θ is less than 5°, a relationship between the size H and the size L may be calculated by using the foregoing formula. After the size H of the limiting member 700 and the size L of the distance between the limiting member 700 and the chip 200 are controlled, the included angle between the first heat dissipation surface 201 and the second heat dissipation surface 401 may be limited to be less than or equal to 5° when the heat sink 400 tilts relative to the chip 200. This effectively protects the chip 200.

It may be understood that the second heat dissipation surface 401 may not be a plane. For example, when the second heat dissipation surface 401 is an arc surface, the size $H_2$ from the second heat dissipation surface 401 of the boss 410 to the limiting surface 4331 is a size from a local position corresponding to an edge of the chip 200 on the second heat dissipation surface 401 to the limiting surface 4331.

Figure 7:
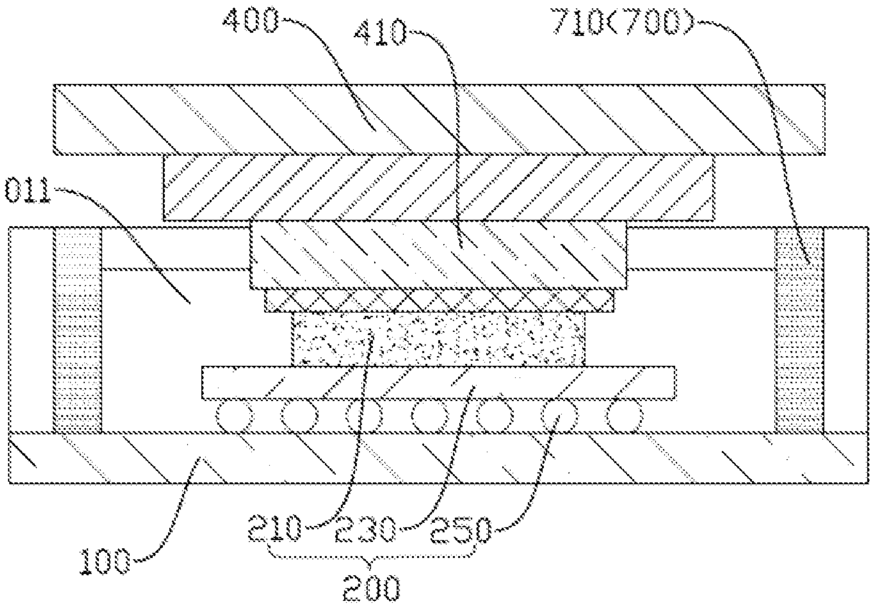
FIG. 7 is a partial sectional view of an electronic apparatus according to another embodiment of this disclosure.
Figure 8:
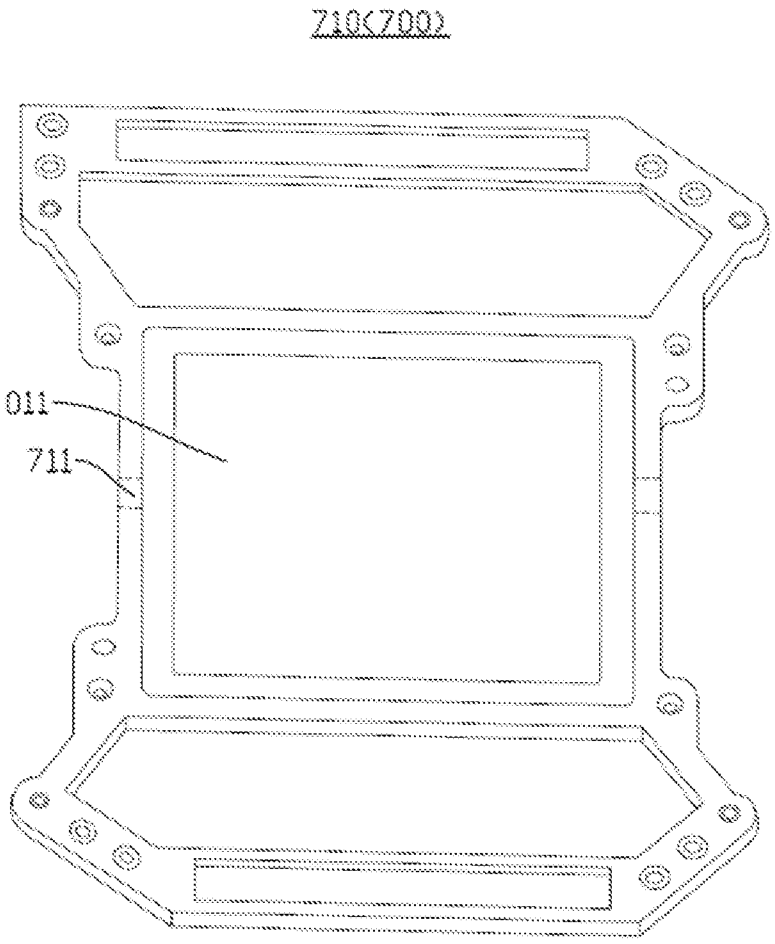
FIG. 8 is a schematic diagram of a structure of a support frame according to another embodiment of this disclosure.

FIG. 7 is a partial sectional view of an electronic apparatus 001 according to an embodiment of this disclosure. FIG. 8 is a schematic diagram of a structure of a support frame 710 according to an embodiment of this disclosure.

As shown in FIG. 7, a limiting member 700 in the electronic apparatus 001 is a support frame 710. The support frame 710 is fastened to a board body of a circuit board 100. The support frame 710 is used as the limiting member 700. This may improve overall strength of the circuit board 100, and reduce deformation of the circuit board 100 under force.

Refer to FIG. 7 and FIG. 8. A window 011 is provided in the middle of the support frame 710. When the support frame 710 is fastened to the circuit board 100, a chip 200 is located inside the window 011. A limiting surface 4331 of a heat sink 400 faces the support frame 710.

In a first direction X, a size of the support frame 710 is greater than a size of the chip 200. A local area corresponding to the limiting surface 4331 of the support frame 710 may form a limiting area 711. When the heat sink 400 tilts relative to the chip 200, the limiting surface 4331 of the heat sink 400 is in contact with the limiting area 711 of the support frame 710, and the support frame 710 may prevent the heat sink 400 from further tilting. This protects the chip 200, and reduces a probability that the chip 200 is crushed.

Figure 9:
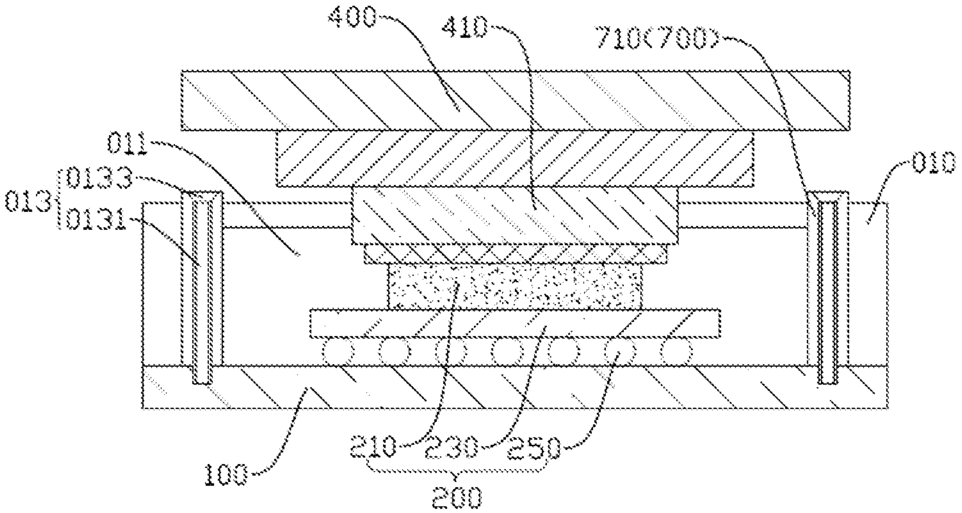
FIG. 9 is a partial sectional view of an electronic apparatus according to another embodiment of this disclosure.

FIG. 9 is a partial sectional view of an electronic apparatus 001 according to an embodiment of this disclosure.

As shown in FIG. 9, a limiting member 700 in the electronic apparatus 001 is a support frame 710. The support frame 710 is fastened to a board body of a circuit board 100. The support frame 710 is used as the limiting member 700. This may improve overall strength of the circuit board 100, and reduce deformation of the circuit board 100 under force.

The support frame 710 includes a through hole part 013. The through hole part 013 forms a limiting area 711 of the support frame 710. The through hole part 013 may be disposed based on sizes of a circuit board 100 and a chip 200. In this way, when a heat sink 400 tilts relative to the chip 200, an angle between a first heat dissipation surface 201 and a second heat dissipation surface 401 is not greater than 5° after the through hole part 013 is in contact with the heat sink 400.

A fastening through hole 0131 is provided in the through hole part 013. The fastening through hole 0131 extends in a direction perpendicular to the first heat dissipation surface 201 and passes through the entire support frame 710. A bolt passes through the fastening through hole 0131 and is in a threaded connection with the circuit board 100. The support frame 710 and the circuit board 100 are fastened by using the bolt. To reduce impact of the bolt on a size of a limiting member, a counterbore 0133 is provided at an end of the fastening through hole 0131. After the bolt is disposed in the fastening through hole 0131, a head 2533 of the bolt is accommodated in the counterbore 0133.

Figure 10:
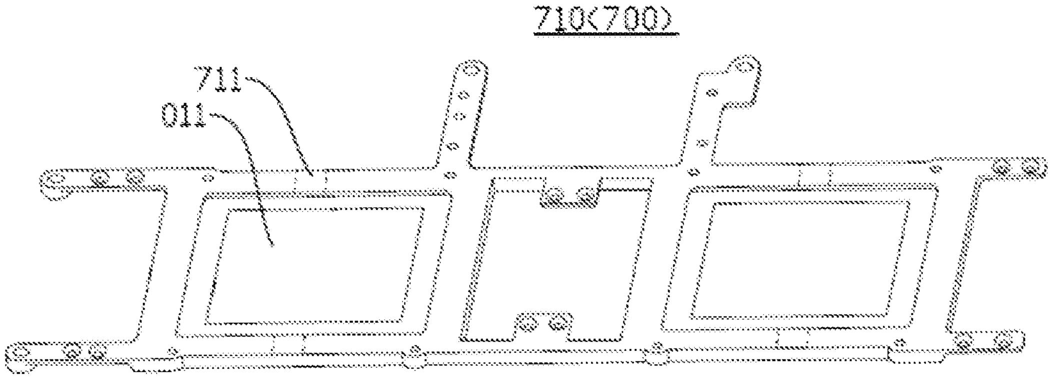
FIG. 10 is a schematic diagram of a structure of a support frame according to another embodiment of this disclosure.

FIG. 10 is a schematic diagram of a structure of a support frame 710 according to an embodiment of this disclosure.

As shown in FIG. 10, the support frame 710 may be disposed on a circuit board 100 as a limiting member 700. The support frame 710 has two windows 011. After the support frame 710 is disposed on the circuit board 100, each window 011 may correspond to one chip 200.

Each chip 200 corresponds to one independent heat sink 400. The heat sink 400 is disposed on the circuit board 100 to dissipate heat of the chip 200. A part of the support frame 710 forms a limiting area 711. When the heat sink 400 tilts relative to the chip 200, after being in contact with the heat sink 400, the limiting area 711 of the support frame 710 may prevent the heat sink 400 from further tilting. This controls an included angle between a first heat dissipation surface 201 and a second heat dissipation surface 401, and protects the chip 200.

When sizes of chips 200 in the two windows 011 are different, different heat sinks 400 may be selected for matching. For example, heat sinks 400 having different sizes of bosses 410 are selected. In this way, a same support frame 710 can simultaneously control displacement of two heat sinks 400, and second heat dissipation surfaces 401 of the two heat sinks 400 cannot tilt by more than 5° relative to the first heat dissipation surface 201.

Figure 11:
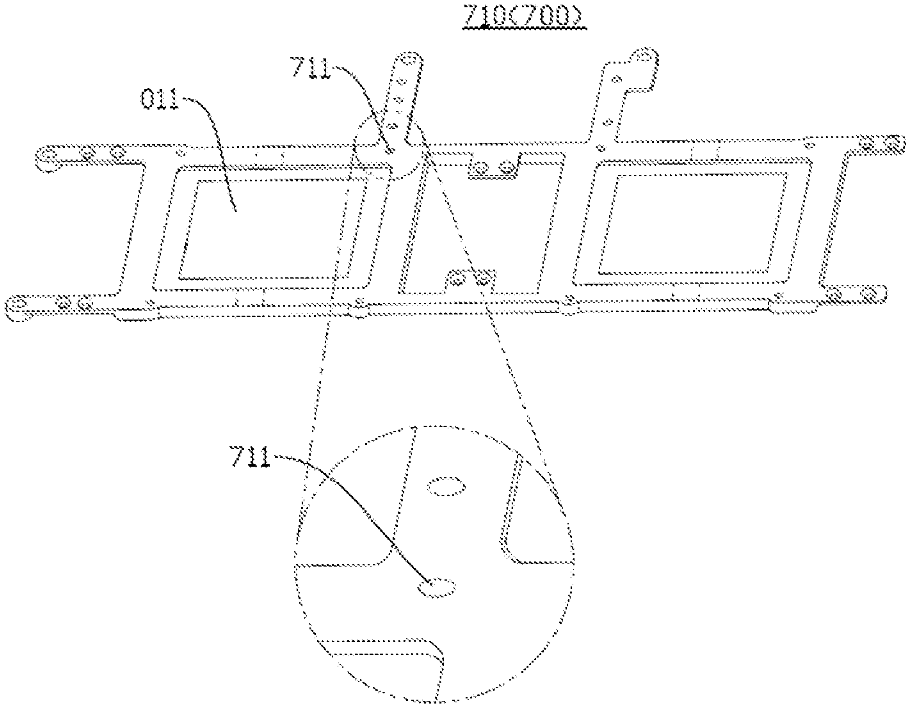
FIG. 11 is a schematic diagram of a structure of a support frame according to an embodiment of this disclosure.

FIG. 11 is a schematic diagram of a structure of a support frame 710 according to an embodiment of this disclosure.

As shown in FIG. 11, the support frame 710 may be disposed on a circuit board 100. A limiting area 711 is formed at a protruding member on the support frame 710. Optionally, the protruding member may be fastened to a main body of the support frame 710 by using a thread. The support frame 710 has two windows 011. After the support frame 710 is disposed on the circuit board 100, each window 011 may correspond to one chip 200.

Each chip 200 corresponds to one independent heat sink 400. The heat sink 400 is disposed on the circuit board 100 to dissipate heat of the chip 200. The limiting area 711 is formed at a position of the protruding member of the support frame 710. When the heat sink 400 tilts relative to the chip 200, after being in contact with the heat sink 400, the limiting area 711 of the support frame 710 may prevent the heat sink 400 from further tilting, to control an included angle between a first heat dissipation surface 201 and a second heat dissipation surface 401, and protect the chip 200.

When sizes of chips 200 in the two windows 011 are different, different heat sinks 400 may be selected for matching. For example, heat sinks 400 having different sizes of bosses 410 are selected. In this way, a same support frame 710 can simultaneously control displacement of two heat sinks 400, and second heat dissipation surfaces 401 of the two heat sinks 400 cannot tilt by more than 5° relative to the first heat dissipation surface 201.

Figure 12:
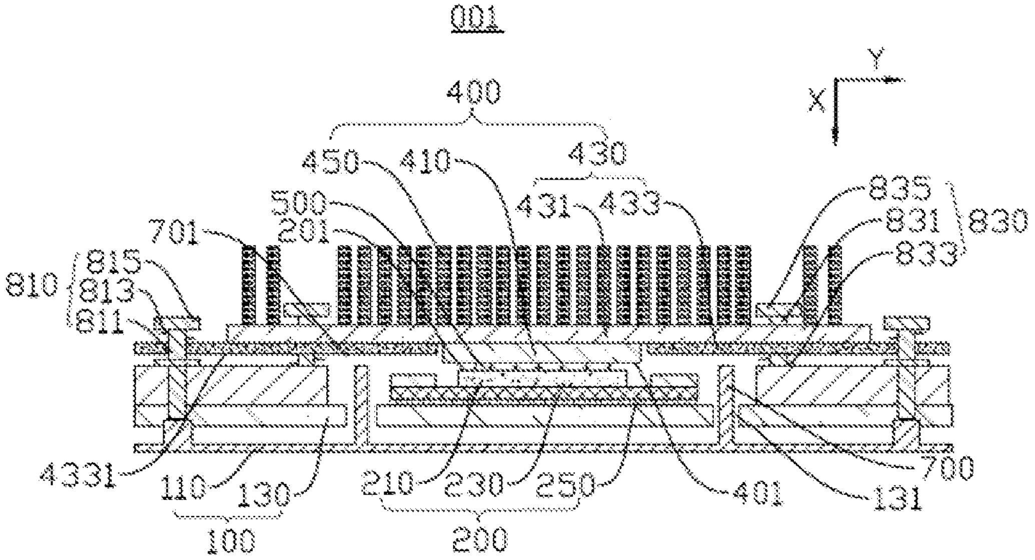
FIG. 12 is a partial sectional view of an electronic apparatus according to another embodiment of this disclosure.

FIG. 12 is a sectional view of an electronic apparatus 001 according to an embodiment of this disclosure.

As shown in FIG. 12, in the electronic apparatus 001, a plurality of mounting through holes 131 are provided in a second board 130, and a plurality of limiting members 700 are disposed on a first board 110. The second board 130 is a PCB. The second board 130 is electrically connected to a chip 200. The first board 110 is a metal plate. The first board 110 has high strength. The second board 130 is disposed above the first board 110. The second board 130 may be strengthened by using the first board 110, so that the second board 130 is not likely to be deformed due to external force.

The limiting member 700 of the first board 110 extends towards a heat sink 400 and passes through the mounting through hole 131. When the heat sink 400 tilts relative to the chip 200, the heat sink 400 may be in contact with the limiting member 700 of the second board 130. In this way, the limiting member 700 prevents the heat sink 400 from further tilting, to protect the chip 200.

In the foregoing various electronic apparatuses 001, a first heat dissipation surface 201 of the heat sink 400 and a second heat dissipation surface 401 of the chip 200 can have a small spacing, so that a size of a heat dissipation medium 500 in a first direction X is small. This improves heat dissipation efficiency of the chip 200 and the heat sink 400. The limiting member 700 is disposed. This can limit movement of the heat sink 400 relative to the chip 200, and limit an included angle between the second heat dissipation surface 401 of the heat sink 400 and the first heat dissipation surface 201 of the chip 200. A value of the included angle is limited. This may reduce local pressure of the chip 200, and reduce a probability that the chip 200 is crushed due to excessively large pressure when the electronic apparatus 001 is subject to external force. When a size of the heat sink 400 and a size of the chip 200 are determined, a calculation formula for a size of the limiting member 700 and a position of the limiting member 700 is further provided. The calculation formula is used to guide molding and mounting of the limiting member 700. This may allow the limiting member 700 to better limit movement of the heat sink 400, and further reduce the probability that the chip 200 is crushed.

The foregoing description provides certain specific implementations of this disclosure, but is not intended to limit the protection scope of this disclosure. Any variation or replacement within the technical scope disclosed in this disclosure shall fall within the disclosed scope of this disclosure.

What is claimed is:

1. An electronic apparatus, comprising:

a circuit board;

a chip fastened to the circuit board, wherein a surface that is of the chip and that is away from the circuit board forms a first heat dissipation surface;

a heat sink disposed on the circuit board, wherein a surface that is of the heat sink and that faces the circuit board forms a second heat dissipation surface, and a heat dissipation medium is provided between the second heat dissipation surface and the first heat dissipation surface;

a limiting member disposed on one of the heat sink and the circuit board, and forming a gap with the other of the heat sink and the circuit board;

a pressing part comprising a first elastic member, one end of the first elastic member is configured to act on the heat sink and the other end is configured to act on the circuit board to provide elastic force to press the heat sink against the chip; and a floating part comprising a second elastic member, one end of the second elastic member is configured to act on the heat sink, and the other end is configured to act on the circuit board, to provide elastic force to move the heat sink away from the chip.

2. The electronic apparatus according to claim 1, wherein the pressing part further comprises a first guide post; and the first guide post is fastened to the circuit board, the heat sink is provided with a first guide hole, and the first guide post passes through the first guide hole.

3. The electronic apparatus according to claim 2, wherein the first elastic member comprises a first compression spring;

a first mounting head is disposed at one end that is of the first guide post and that is away from the circuit board; and the first compression spring is sleeved outside the first guide post, one end of the first compression spring is configured to act on the first mounting head, and the other end is configured to act on the heat sink.

4. The electronic apparatus according to claim 1, wherein the floating part further comprises a second guide post; and the second guide post is fastened to the circuit board, the heat sink is provided with a second guide hole, and the second guide post passes through the second guide hole.

5. The electronic apparatus according to claim 4, wherein the second elastic member comprises a second compression spring; and the second compression spring is sleeved outside the second guide post, one end of the second compression spring is configured to act on the circuit board, and the other end is configured to act on the heat sink.

6. The electronic apparatus according to claim 1, wherein the heat sink comprises a mounting part and a boss, the boss is disposed on a surface that is of the mounting part and that faces the chip, and an end face of the boss forms the second heat dissipation surface;

the mounting part has a limiting surface; and the gap is formed between the limiting surface and the limiting member, or the limiting member is fixedly disposed on the limiting surface.

7. The electronic apparatus according to claim 1, wherein the limiting member is a support frame, the support frame has a window, and the chip is located in the window.

8. The electronic apparatus according to claim 7, wherein a fastening through hole that is configured to mount a bolt is provided in the limiting member, and the bolt is configured to fasten the support frame and the circuit board.

9. The electronic apparatus according to claim 7, wherein the support frame comprises at least two windows, and one chip is disposed at a position corresponding to each window on the circuit board.

10. The electronic apparatus according to claim 1, wherein the circuit board comprises a first board and a second board;

the chip is disposed on the second board, and a plurality of mounting through holes are provided on the second board; and the limiting member is disposed on the first board, and the limiting member passes through the second board from the mounting through hole.

* * * * *